United States Patent
Paz de Araujo et al.

(10) Patent No.: US 10,217,935 B2
(45) Date of Patent: Feb. 26, 2019

(54) CORRELATED ELECTRON DEVICE FORMED VIA CONVERSION OF CONDUCTIVE SUBSTRATE TO A CORRELATED ELECTRON REGION

(71) Applicant: ARM Ltd., Cambridge (GB)

(72) Inventors: Carlos Alberto Paz de Araujo, Colorado Springs, CO (US); Jolanta Bozena Celinska, Colorado Springs, CO (US); Christopher Randolph McWilliams, Colorado Springs, CO (US); Lucian Shifren, San Jose, CA (US); Kimberly Gay Reid, Austin, TX (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/371,457

(22) Filed: Dec. 7, 2016

(65) Prior Publication Data
US 2018/0159029 A1     Jun. 7, 2018

(51) Int. Cl.
*H01L 45/00*     (2006.01)

(52) U.S. Cl.
CPC ............ *H01L 45/12* (2013.01); *H01L 45/04* (2013.01); *H01L 45/1233* (2013.01); *H01L 45/146* (2013.01); *H01L 45/16* (2013.01); *H01L 45/1608* (2013.01); *H01L 45/1641* (2013.01); *H01L 45/1658* (2013.01)

(58) Field of Classification Search
CPC ................ H01L 45/12; H01L 45/1608; H01L 45/16–45/1658
See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz de Araujo et al. | |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 9,627,615 B1 | 4/2017 | Reid et al. | |
| 2008/0106926 A1* | 5/2008 | Brubaker ............ H01L 27/2409 365/148 |

(Continued)

FOREIGN PATENT DOCUMENTS

| | | |
|---|---|---|
| EP | 2082426 B1 | 12/2012 |
| WO | 2017129972 A1 | 8/2017 |
| WO | 2017141042 A1 | 8/2017 |

OTHER PUBLICATIONS

Notification of Transmittal of the International Search Report and the Written Opinion of the International Searching Authority, or the Declaration, App. No. PCT/GB2017/053677, Filed Dec. 6, 2017, dated Mar. 8, 2018, 13 Pages.

*Primary Examiner* — Laura M Menz
*Assistant Examiner* — Candice Chan
(74) *Attorney, Agent, or Firm* — Berkeley Law & Technology Group, LLP (57) ABSTRACT

Subject matter disclosed herein may relate to fabrication of correlated electron materials used, for example, to perform a switching function. In embodiments, processes are described in which a correlated electron material film may be formed over a conductive substrate by converting at least a portion of the conductive substrate to CEM.

15 Claims, 4 Drawing Sheets

(56) References Cited

U.S. PATENT DOCUMENTS

| | | |
|---|---|---|
| 2008/0107801 A1 | 5/2008 | Celinska et al. |
| 2013/0200323 A1 | 8/2013 | Pham et al. |
| 2013/0214232 A1 | 8/2013 | Tendulkar et al. |
| 2013/0285699 A1 | 10/2013 | McWilliams et al. |
| 2016/0163978 A1 | 6/2016 | Paz De Araujo et al. |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |
| 2018/0013062 A1* | 1/2018 | Reid .................. H01L 49/003 |
| 2018/0019394 A1* | 1/2018 | Reid .................. H01L 49/003 |

\* cited by examiner

CORRELATED ELECTRON DEVICE FORMED VIA CONVERSION OF CONDUCTIVE SUBSTRATE TO A CORRELATED ELECTRON REGION

BACKGROUND

Field

This disclosure relates to correlated electron devices, and may relate, more particularly, to approaches toward fabricating correlated electron devices, such as may be used in switches, memory circuits, and so forth, which may exhibit desirable impedance characteristics.

Information

Integrated circuit devices, such as electronic switching devices, for example, may be found in a wide range of electronic device types. For example, memory and/or logic devices may incorporate electronic switches suitable for use in computers, digital cameras, smart phones, tablet devices, personal digital assistants, and so forth. Factors that relate to electronic switching devices, which may be of interest to a designer in considering whether an electronic switching device is suitable for a particular application, may include physical size, storage density, operating voltages, impedance ranges, and/or power consumption, for example. Other factors that may be of interest to designers may include, for example, cost of manufacture, ease of manufacture, scalability, and/or reliability. Moreover, there appears to be an ever-increasing need for memory and/or logic devices that exhibit characteristics of lower power and/or higher speed. However, conventional fabrication techniques, which may be well suited for certain types of memory and/or logic devices, may not be entirely suitable for use in fabricating devices that utilize correlated electron materials.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) films to form, for example, a correlated electron switch, such as may be utilized to form a correlated electron random access memory (CERAM) in memory and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects. In this context, a CEM switch, for example, may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in resistive RAM devices. In one aspect, a substantially rapid conductor-to-insulator transition in a CEM device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a correlated electron material between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may bring about a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. As described with reference to FIG. 2, a CEM may comprise one or more "d-block" elements from of the Periodic Table of Elements, such as transition metals, transition metal compounds, one or more transition metal oxides (TMOs), for example, having a concentration of at least 90.0% of the one or more "d-block" elements. Also as described with reference to FIG. 2, a CEM may comprise one or more "f-block" elements of the Periodic Table of Elements, having a concentration of at least 90.0% of the one or more "f-block" elements. F-block elements include rare earth elements, oxides of rare earth elements, oxides comprising one or more rare earth transitional metals, perovskites, yttrium, and/or ytterbium, or any other compounds comprising metals from the lanthanide or actinide series of the Periodic Table, for example, and claimed subject matter is not limited in scope in this respect.

Figure 1A:
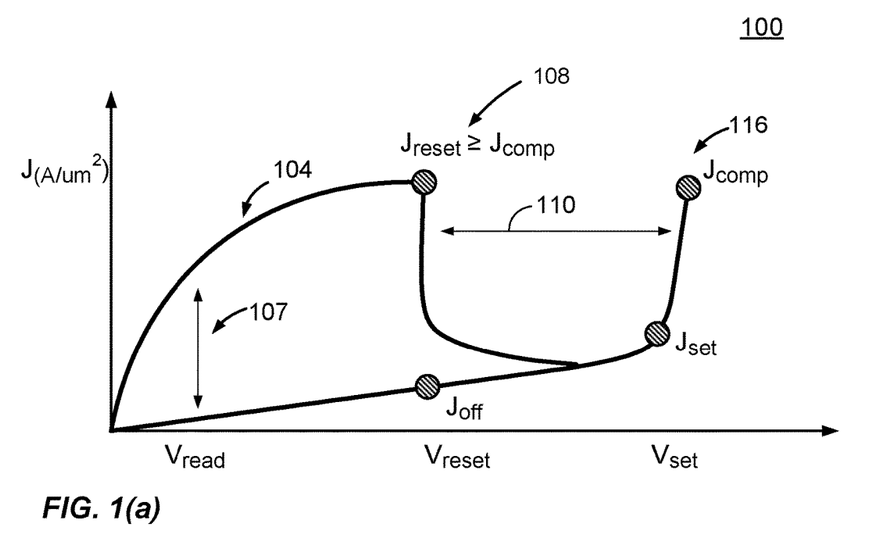
FIG. 1(a) is an illustration of an embodiment of a current density versus voltage profile of a device formed from a correlated electron material.

FIG. 1(*a*) is an illustration of an embodiment 100 of a current density versus voltage profile of a device formed from a correlated electron material. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM device to a relatively low-impedance memory state. Conversely, application of a voltage $V_{reset}$ and a current density $J_{reset}$ may bring about a transition of the CEM device to a relatively high-impedance memory state. As shown in FIG. 1(*a*), reference designator 110 illustrates the voltage range that may separate $V_{set}$ from $V_{reset}$. Following placement of the CEM device into a high-impedance state or a low-impedance state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1(a) may comprise any transition metal oxide (TMO), such as, for example, perovskites, Mott insulators, charge exchange insulators, and Anderson disorder insulators. In particular implementations, such as described in reference to FIG. 2, a CEM device may be formed from switching materials, such as nickel oxide, cobalt oxide, iron oxide, yttrium oxide, titanium yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells, such as those listed above, may exhibit sufficient impedance switching properties for use in a CEM device. Other implementations may employ other transition metal compounds without deviating from claimed subject matter.

In one aspect, the CEM device of FIG. 1(a) may comprise other types of transition metal oxide variable impedance materials, though it should be understood that these are exemplary only and are not intended to limit claimed subject matter. Nickel oxide (NiO) is disclosed as one particular TMO. NiO materials discussed herein may be doped with extrinsic ligands, such as carbonyl (CO), which may establish and/or stabilize variable impedance properties and/or bring about a P-type operation in which a CEM may be more conductive in a low-impedance state (e.g., region 104, described herein). Thus, in another particular example, NiO doped with extrinsic ligands may be expressed as NiO:$L_x$, where $L_x$ may indicate a ligand element or compound and x may indicate a number of units of the ligand for one unit of NiO. A value of x may be determined for any specific ligand and any specific combination of ligand with NiO or with any other transition metal compound simply by balancing valences. Other dopant ligands, which may bring about or enhance conductivity in a low-impedance state in addition to carbonyl may include: nitrosyl (NO), triphenylphosphine ($PPH_3$), phenanthroline ($C_{12}H_8N_2$), bipyridine ($C_{10}H_8N_2$), ethylenediamine ($C_2H_4(NH_2)_2$), ammonia ($NH_3$), acetonitrile ($CH_3CN$), Fluoride (F), Chloride (Cl), Bromide (Br), cyanide (CN), sulfur (S), and others.

In this context, a "P-type" doped CEM as referred to herein means a first type of CEM comprising a particular molecular dopant that exhibits increased electrical conductivity, relative to an undoped CEM, if the CEM is operated in a low-impedance state, such as the low-impedance state indicated by region 104 of FIG. 1(a) described herein. Introduction of a substitutional ligand, such as CO and $NH_3$, may operate to enhance the P-type nature of a NiO CEM. Accordingly, an attribute of P-type operation of a CEM may include, at least in particular embodiments, an ability to tailor or customize electrical conductivity of a CEM, operated in a low-impedance state, by controlling an atomic concentration of a P-type dopant in a CEM. In particular embodiments, an increased atomic concentration of a P-type dopant may bring about increased electrical conductivity of a CEM, although claimed subject matter is not limited in this respect.

In another embodiment, the CEM device of FIG. 1(a) may comprise other transition metal oxide variable impedance materials, having an atomic concentration of at least 90.0%, such as nitrogen-containing ligands, though it should be understood that these are exemplary only and are not intended to limit claimed subject matter. Nickel oxide (NiO) is disclosed as one particular TMO. NiO materials discussed herein may be doped with extrinsic nitrogen-containing ligands, which may stabilize variable impedance properties. In particular, NiO variable impedance materials disclosed herein may include nitrogen-containing molecules of the form $C_xH_yN_z$ (wherein x≥0, y≥0, z≥0, and wherein at least x, y, or z comprise values>0) such as: ammonia ($NH_3$), cyano ($CN^-$), azide ion ($N_3^-$) ethylene diamine ($C_2H_8N_2$), phen(1,10-phenanthroline) ($C_{12}H_8N_2$), 2,2'bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate ($NCS^-$), for example. NiO variable impedance materials disclosed herein may include members of an oxynitride family ($N_xO_y$, wherein x and y comprise whole numbers, and wherein x≥0 and y≥0 and at least x or y comprise values>0), which may include, for example, nitric oxide (NO), nitrous oxide ($N_2O$), nitrogen dioxide ($NO_2$), or precursors with an $NO_3^-$ ligand. In embodiments, metal precursors comprising nitrogen-containing ligands, such as ligands amines, amides, alkylamides nitrogen-containing ligands with NiO by balancing valences.

In accordance with FIG. 1(a), if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a relatively high-impedance state, for example, responsive to a Mott transition. This may correspond to point 108 of the voltage versus current density profile of FIG. 1(a). At, or suitably near this point, electrons are no longer screened and become localized near the metal ion. This correlation may result in a strong electron-to-electron interaction potential, which may operate to split the bands to form a relatively high-impedance material. If the CEM device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

According to an embodiment, current in a CEM device may be controlled by an externally applied "compliance" condition, which may be determined at least partially on the basis of an applied external current, which may be limited during a write operation, for example, to place the CEM device into a relatively high-impedance state. This externally-applied compliance current may, in some embodiments, also set a condition of a current density for a subsequent reset operation to place the CEM device into a relatively high-impedance state. As shown in the particular implementation of FIG. 1(a), a current density $J_{comp}$ may be applied during a write operation at point 116 to place the CEM device into a relatively high-impedance state, may determine a compliance condition for placing the CEM device into a low-impedance state in a subsequent write operation. As shown in FIG. 1(a), the CEM device may be subsequently placed into a low-impedance state by application of a current density $J_{reset} \geq J_{comp}$ at a voltage $V_{reset}$ at point 108, at which $J_{comp}$ is externally applied.

In embodiments, compliance may set a number of electrons in a CEM device that may be "captured" by holes for the Mott transition. In other words, a current applied in a write operation to place a CEM device into a relatively low-impedance memory state may determine a number of holes to be injected to the CEM device for subsequently transitioning the CEM device to a relatively high-impedance memory state.

As pointed out above, a reset condition may occur in response to a Mott transition at point 108. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \tag{1}$$
$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1(*a*), may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \tag{2}$$
$$Q(V_{MI}) = qn(V_{MI})$$

Wherein $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \tag{3}$$
$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}(V_{MI})}\right)^3$$

In which $A_{CEM}$ is a cross-sectional area of a CEM device; and $J_{reset}(V_{MI})$ may represent a current density through the CEM device to be applied to the CEM device at a threshold voltage $V_{MI}$, which may place the CEM device into a relatively high-impedance state.

According to an embodiment, a CEM device, which may be utilized to form a CEM switch, a CERAM memory device, or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, responsive to a sufficient quantity of electrons injected, the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance state.

In particular embodiments, changes in impedance states of CEM devices, such as changes from a low-impedance state to a substantially dissimilar high-impedance state, for example, may be brought about by "back-donation" of electrons of compounds comprising $Ni_xO_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of a lattice structure, for example, comprising the transition metal, transition metal compound, transition metal oxide, or comprising a combination thereof. Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbonyl (CO) or a nitrogen-containing dopant, such as ammonia ($NH_3$), ethylene diamine ($C_2H_8N_2$), or members of an oxynitride family ($N_xO_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., NiO:CO or NiO:$NH_3$), thereby permitting the nickel oxide material to switch to exhibiting a substantially dissimilar impedance property, such as a high-impedance property, during device operation.

Thus, in this context, an electron back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising a transition metal, transition metal compound, or a transition metal oxide, may exhibit low-impedance properties if the transition metal, such as nickel, for example, is placed into an oxidation state of 2+ (e.g., $Ni^{2+}$ in a material, such as NiO:CO or NiO:$NH_3$). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \tag{4}$$

Such disproportionation, in this instance, refers to formation of nickel ions as $Ni^{1+} + Ni^{3+}$ as shown in expression (4), which may bring about, for example, a relatively high-impedance state during operation of the CEM device. In an embodiment, a dopant such as a carbon-containing ligand, carbonyl (CO) or a nitrogen-containing ligand, such as an ammonia molecule ($NH_3$), may permit sharing of electrons during operation of a CEM device so as to give rise to the disproportionation reaction of expression (4), and its reversal, substantially in accordance with expression (5), below:

$$Ni^{1+}+Ni^{3+}\rightarrow 2Ni^{2+} \quad (5)$$

As previously mentioned, reversal of the disproportionation reaction, as shown in expression (5), permits nickel-based CEM to return to a relatively low-impedance state.

In embodiments, depending on a molecular concentration of $NiO:CO$ or $NiO:NH_3$, for example, which may vary from values approximately in the range of an atomic concentration of 0.1% to 10.0%, $V_{reset}$ and $V_{set}$, as shown in FIG. 1(a), may vary approximately in the range of 0.1 V to 10.0 V subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of an electron back-donating material, such as $NiO:CO$ or $NiO:NH_3$ and other materials present in the CEM device, as well as other process variations, and claimed subject matter is not limited in this respect.

In certain embodiments, atomic layer deposition may be utilized to form or to fabricate films comprising NiO materials, such as $NiO:CO$ or $NiO:NH_3$. In this context, a "layer" as the term is used herein means a sheet or coating of material, which may be disposed on or over an underlying formation, such as a substrate. For example, a layer deposited on an underlying substrate by way of an atomic layer deposition process may comprise a thickness of a single atom, comprising a thickness of a fraction of an angstrom (e.g., 0.6 Å). However, a layer encompasses a sheet or coating having a thickness greater than that of a single atom depending, for example, on a process utilized to fabricate films comprising a CEM film having an atomic concentration of at least 90.0%. In embodiments, a CEM film may comprise a sufficient number of layers, to permit electron back-donation during operation of a CEM device in a circuit environment, for example, to give rise to a low-impedance state. Also during operation in a circuit environment, for example, electron back-donation may be reversed so as to give rise to a substantially dissimilar impedance state, such as a high-impedance state, for example.

Also in this context, a "substrate" as used herein means a planar structure comprising a surface that enables materials, such as materials operating to provide an electrical function, to be deposited or placed on or over the substrate. For example, in a CEM-based device, a conductive substrate may operate to convey an electrical current to the CEM-based device in contact with the conductive substrate. In embodiments, a conductive substrate may be fabricated in layers and may comprise a titanium or titanium-based material, such as titanium nitride (TiN). In embodiments, a conductive substrate may comprise one or more d-block or f-block elements other than titanium, such as platinum, copper, aluminum, cobalt, nickel, tungsten, tungsten nitride, cobalt silicide, ruthenium, ruthenium oxide, chromium, gold, palladium, indium tin oxide, tantalum, silver, iridium, or iridium oxide or any combination thereof, and claimed subject matter is not limited to any particular composition of conductive substrate material. It should be noted, however, that claimed subject matter is intended to embrace all conductive substrates of the form $ML:L_{dopant}$, in which "M" indicates a metal ion, such as a d-block or f-block element, "L" indicates a dominant ligand, such as oxygen in an NiO molecule, and in which $L_{dopant}$ comprises a dopant ligand, such as carbonyl (CO) in an $NiO:CO$ complex and $NH_3$ in $NiO:NH_3$ complex, just to name two possible examples.

In particular embodiments, atomic layer deposition may utilize two or more precursors to deposit components of, for example, $NiO:CO$ or $NiO:NH_3$, or other transition metal oxide, transition metal, or combination thereof, onto a conductive substrate. In an embodiment, layers of a CEM device may be deposited utilizing separate precursor molecules, AX and BY, according to expression (6a), below:

$$AX_{(gas)}BY_{(gas)}=AB_{(solid)}XY_{(gas)} \quad (6a)$$

Wherein "A" of expression (6a) corresponds to a transition metal, transition metal compound, transition metal oxide, or any combination thereof. In embodiments, a transition metal oxide may comprise nickel, but may comprise other transition metals, transition metal compound, and/or transition metal oxides, such as aluminum, cadmium, chromium, cobalt, copper, gold, iron, manganese, mercury, molybdenum, nickel palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate ($YTiO_3$).

In embodiments, "X" of expression (6a) may comprise a ligand, such as organic ligand, comprising amidinate (AMD), dicyclopentadienyl $(Cp)_2$, diethylcyclopentadienyl $(EtCp)_2$, Bis(2,2,6,6-tetramethylheptane-3,5-dionato) $((thd)_2)$, acetylacetonate (acac), bis(methylcyclopentadienyl) $((CH_3C_5H_4)_2)$, dimethylglyoximate $(dmg)_2$, 2-amino-pent-2-en-4-onato $(apo)_2$, $(dmamb)_2$ where dmamb=1-dimethylamino-2-methyl-2-butanolate, (dmamp)2 where dmamp=1-dimethylamino-2-methyl-2-propanolate, Bis (pentamethylcyclopentadienyl) $(C_5(CH_3)_5)_2$ and carbonyl $(CO)_4$. Accordingly, in some embodiments, nickel-based precursor AX may comprise, for example, nickel amidinate (Ni(AMD)), nickel dicyclopentadienyl $(Ni(Cp)_2)$, nickel diethylcyclopentadienyl $(Ni(EtCp)_2)$, Bis(2,2,6,6-tetramethylheptane-3,5-dionato)Ni(II) $(Ni(thd)_2)$, nickel acetylacetonate $(Ni(acac)_2)$, bis(methylcyclopentadienyl)nickel (Ni $(CH_3C_5H4)_2$, Nickel dimethylglyoximate $(Ni(dmg)_2)$, Nickel 2-amino-pent-2-en-4-onato $(Ni(apo)_2)$, $Ni(dmamb)_2$ where dmamb=1-dimethylamino-2-methyl-2-butanolate, $Ni(dmamp)_2$ where dmamp=1-dimethylamino-2-methyl-2-propanolate, Bis(pentamethylcyclopentadienyl) nickel (Ni $(C_5(CH_3)_5)_2$, and nickel carbonyl $(Ni(CO)_4)$, just to name a few examples. In expression (6a), precursor "BY" may comprise an oxidizer, such as oxygen ($O_2$), ozone ($O_3$), nitric oxide (NO), hydrogen peroxide ($H_2O_2$), just to name a few examples. In other embodiments as will be described further herein, plasma may be used with an oxidizer to form oxygen radicals.

However, in particular embodiments, a dopant comprising an electron back-donating material in addition to precursors AX and BY may be utilized to form layers of a CEM device. An additional dopant ligand comprising an electron back-donating material, which may co-flow with precursor AX, may permit formation of electron back-donating compounds, substantially in accordance with expression (6b), below. In embodiments, a dopant comprising an electron back-donating material, such as ammonia (NH$_3$), methane (CH$_4$), carbon monoxide (CO), or other material may be utilized, as may other ligands comprising carbon or nitrogen or other dopants comprising electron back-donating materials listed above. Thus, expression (6a) may be modified to include an additional dopant ligand comprising an electron back-donating material substantially in accordance with expression (6b), below:

$$AX_{(gas)} + (NH_3 \text{ or other ligand comprising nitrogen}) + BY_{(gas)} = AB:NH_{3(solid)} + XY_{(gas)} \quad (6b)$$

It should be noted that concentrations, such as atomic concentration, of precursors, such as AX, BY, and NH$_3$ (or other ligand comprising nitrogen) of expressions (6a) and (6b) may be adjusted so as to bring about a final atomic concentration of nitrogen or carbon dopant comprising an electron back-donating material in a fabricated CEM device, such as in the form of ammonia (NH$_3$) or carbonyl (CO) comprising an atomic concentration of between approximately 0.1% and 10.0%. However, claimed subject matter is not necessarily limited to the above-identified precursors and/or atomic concentrations. Rather, claimed subject matter is intended to embrace all such precursors utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices. In expressions (6a) and (6b), "BY" may comprise an oxidizer, such as oxygen (O$_2$), ozone (O$_3$), nitric oxide (NO), hydrogen peroxide (H$_2$O$_2$), just to name a few examples. In other embodiments, plasma may be used with an oxidizer (BY) to form oxygen radicals. Likewise, plasma may be used with the doping species comprising an electron back-donating material to form an activated species to control the doping concentration of a CEM.

In particular embodiments, such as embodiments utilizing atomic layer deposition, a conductive substrate may be exposed to precursors, such as AX and BY, as well as dopants comprising electron back-donating materials (such as ammonia or other ligands comprising metal-nitrogen bonds, including, for example, nickel-amides, nickel-imides, nickel-amidinates, or combinations thereof) in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:NH$_3$, for example, is performed, chamber temperature ranges approximately in the range of 20.0° C. and 400.0° C. may be utilized. Responsive to exposure to precursor gases (e.g., AX, BY, NH$_3$, or other ligand comprising nitrogen), such gases may be purged from the heated chamber for durations approximately in the range of 0.5 seconds to 180.0 seconds. It should be noted, however, that these are merely examples of potentially suitable ranges of chamber temperature and/or time and claimed subject matter is not limited in this respect.

In certain embodiments, a single two-precursor cycle (e.g., AX and BY, as described with reference to expression 6(a)) or a single three-precursor cycle (e.g., AX, NH$_3$, CH$_4$, or other ligand comprising nitrogen, carbon or other dopant comprising an electron back-donating material, and BY, as described with reference to expression 6(b)) utilizing atomic layer deposition may bring about a CEM device layer comprising a thickness approximately in the range of 0.6 Å to 5.0 Å per cycle). Accordingly, in an embodiment, to form a CEM device film comprising a thickness of approximately 500.0 Å utilizing an atomic layer deposition process in which layers comprise a thickness of approximately 0.6 Å, 800-900 cycles, for example, may be utilized. In another embodiment, utilizing an atomic layer deposition process in which layers comprise approximately 5.0 Å, 100 two-precursor cycles, for example. It should be noted that atomic layer deposition may be utilized to form CEM device films having other thicknesses, such as thicknesses approximately in the range of 1.5 nm and 150.0 nm, for example, and claimed subject matter is not limited in this respect.

In particular embodiments, responsive to one or more two-precursor cycles (e.g., AX and BY), or three-precursor cycles (AX, NH$_3$, CH$_4$, or other ligand comprising nitrogen, carbon or other dopant comprising an electron back-donating material and BY), of atomic layer deposition, a CEM device film may undergo in situ annealing, which may permit improvement of film properties or may be used to incorporate a dopant comprising an electron back-donating material, such as in the form of carbonyl or ammonia, in the CEM device film. In certain embodiments, a chamber may be heated to a temperature approximately in the range of 20.0° C. to 1000.0° C. However, in other embodiments, in situ annealing may be performed utilizing chamber temperatures approximately in the range of 100.0° C. to 800.0° C. In situ annealing times may vary from a duration approximately in the range of 1.0 seconds to 5.0 hours. In particular embodiments, annealing times may vary within more narrow ranges, such as, for example, from approximately 0.5 minutes to approximately 180.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1(a). For example, as previously described herein, in at least one possible embodiment, V$_{reset}$ may occur at a voltage approximately in the range of 0.1 V to 1.0 V, and V$_{set}$ may occur at a voltage approximately in the range of 1.0 V to 2.0 V, for example. Accordingly, electrical switching voltages operating in a range of approximately 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

Figure 1B:
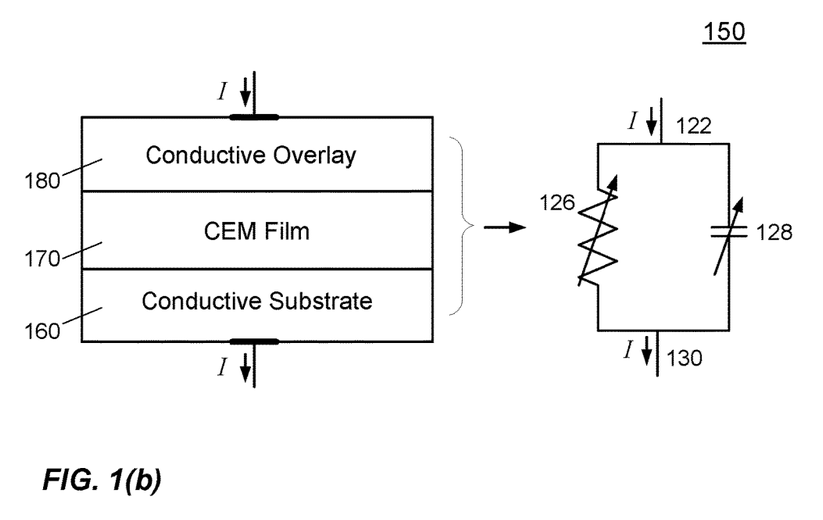
FIG. 1(b) is an illustration of an embodiment of a switching device comprising a correlated electron material and a schematic diagram of an equivalent circuit of a correlated electron material switch.

FIG. 1(b) is an illustration of an embodiment 150 of a switching device comprising a correlated electron material and a schematic diagram of an equivalent circuit of a correlated electron material switch. As previously mentioned, a correlated electron device, such as a CEM switch, a CERAM array, or other type of device utilizing one or more correlated electron materials may comprise variable or complex impedance device that may exhibit characteristics of both variable resistance and variable capacitance. In other words, impedance characteristics for a CEM variable impedance device, such as a device comprising a conductive substrate 160, CEM 170, and conductive overlay 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1(b) as comprising discrete components, a variable impedance device, such as device of embodiment 150, may comprise a substantially homogenous CEM and claimed subject matter is not limited in this respect.

Table 1 below depicts an example truth table for an example variable impedance device, such as the device of embodiment 150.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, Table 1 shows that a resistance of a variable impedance device, such as the device of embodiment 150, may transition between a low-impedance state and a substantially dissimilar, high-impedance state as a function at least partially dependent on a voltage applied across a CEM device. In an embodiment, an impedance exhibited at a low-impedance state may be approximately in the range of 10.0-100,000.0 times lower than an impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Table 1 shows that a capacitance of a variable impedance device, such as the device of embodiment 150, may transition between a lower capacitance state, which, in an example embodiment, may comprise approximately zero (or very little) capacitance, and a higher capacitance state that is a function, at least in part, of a voltage applied across a CEM device.

Figure 2:
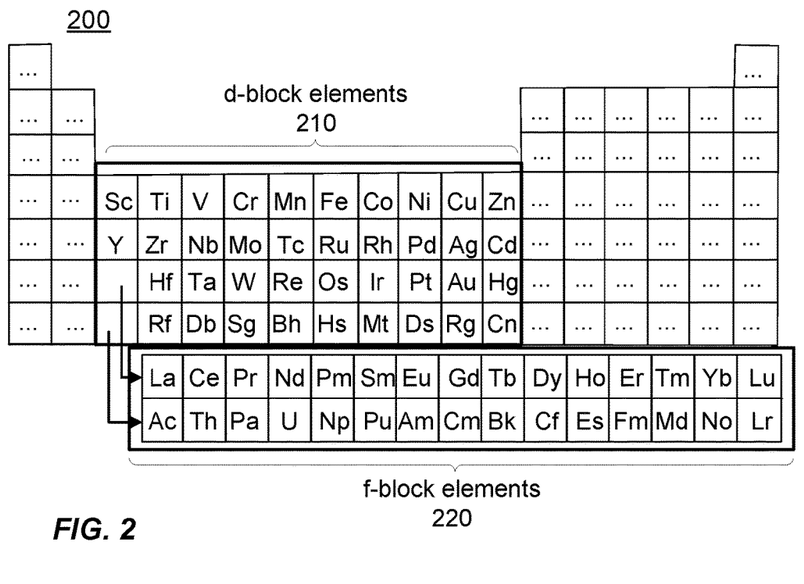
FIG. 2 is a representative Periodic Table of the Elements showing d-block and f-block elements that may form correlated electron materials according to an embodiment.

FIG. 2 is a representative Periodic Table of the Elements 200 showing d-block and f-block elements that may form CEMs according to an embodiment. In this context, a CEM comprising or formed from a "d-block" element of the Periodic Table of the Elements means a CEM comprising a transition metal and/or transition metal oxides from d-block 210 of the Periodic Table of the Elements, which includes scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Jr), platinum (Pt), gold (Au), mercury (Hg), rutherfordium (Rf), dubnium (Db), seaborgium (Sg), bohrium (Bh), hassium (Hs), meitnerium (Mt), darmstadtium (Ds), roentgenium (Rg), or copernicium (Cn), or any combination thereof. Also in this context, a CEM formed from or comprising an "f-block" element of the Periodic Table of the Elements means a CEM comprising a metal or metal oxide from f-block 220 of the Periodic Table of the Elements, which includes lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), neptunium (Np), plutonium (Pu), americium (Am), berkelium (Bk), californium (CO, einsteinium (Es), fermium (Fm), mendelevium (Md), nobelium (No), or lawrencium (Lr), or any combination thereof. As pointed out, elements comprising partially filled d-block or f-block orbitals may bring about electron back-donation, which may give rise to desirable impedance properties if used to form a CEM-based electronic device.

Figures 3A, 3B, 3C:
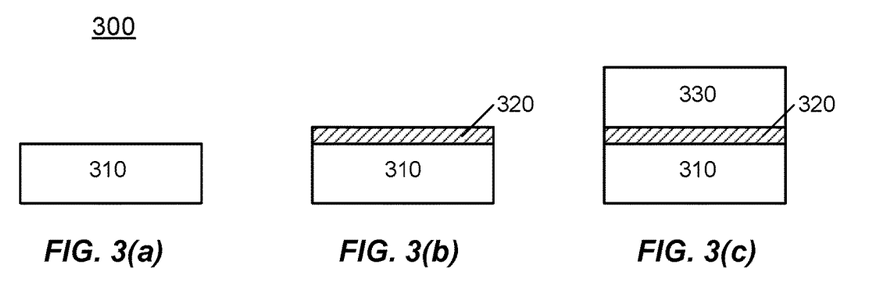
FIGS. 3(a)-3(c) illustrate an embodiment of a sub-process in which a correlated electron material film may be formed from a conductive substrate.

FIGS. 3(a)-3(c) illustrate an embodiment 300 of a sub-process in which a correlated electron material film may be formed from a conductive substrate. At FIG. 3(a), a conductive substrate, such as conductive substrate 310, for example, may comprise a titanium-based substrate, or a substrate that at least comprises a significant atomic concentration of at least 90.0% of titanium, such as TiN. Conductive substrate 310 may be fabricated in layers, for example, for use in a CERAM device or other type of CEM-based device. In embodiments, conductive substrate 310 may comprise one or more d-block or f-block elements (having an atomic concentration of at least 90.0% of one or more d-block or f-block elements) other than titanium, such as platinum, copper, aluminum, cobalt, nickel, tungsten, and so forth, and claimed subject matter is not limited to any particular composition of conductive substrate material. Conductive substrate 310 may be formed by utilizing any suitable process, such as physical vapor deposition (PVD), metal-organic chemical vapor deposition (MOCVD), atomic layer deposition (ALD), and so forth, which may be used to form a conductive structure such as conductive substrate 310. It should be noted, however, that claimed subject matter is intended to embrace all conductive substrates of the form $ML:L_{dopant}$, in which "M" indicates a metal ion, such as a d-block or f-block element, "L" indicates a dominant ligand, such as oxygen in an NiO molecule, and in which $L_{dopant}$ comprises a dopant ligand, such as carbonyl (CO) in an NiO:CO complex and $NH_3$ in NiO:$NH_3$ complex, just to name two possible examples.

In particular embodiments, at least a portion of at least one layer of conductive substrate 310 may be converted to CEM 320, as depicted in FIG. 3(b). Conversion of conductive substrate 310 to CEM 320 may be achieved by way of oxidizing a portion of substrate 310. In this context, the term "oxidizing" as used herein means the chemically combining of metal ions of one or more layers of conductive substrate 310, such as platinum, with elemental or molecular oxygen (e.g., $O^-$, $O_2$, $O_3$, etc.) to form, for example, platinum oxide. In certain embodiments, elemental or molecular oxygen may co-flow with CO, for example, to form a metal-oxycarbide, such as NiO:CO, for example. In certain embodiments, conversion of conductive substrate 310 to CEM 320 may involve oxynitridizing of a portion of substrate 310. In this context, "oxynitridizing" as the term is used herein means the chemical combining of metal ions of one or more layers of conductive substrate 310 with elemental or molecular nitrogen (e.g. N, $NH_3$, and so forth) to form a metal-oxynitride, such as NiO:$NH_3$, for example.

In particular embodiments for which conductive substrate 310 comprises TiN, for example, substrate 310 may be formed in layers utilizing precursors, such as, for example, tetrakis (ethylmethylamido)titanium, tetrakis dimethylamido titanium, tetrakis diethylamido titanium (TDEAT), which may comprise carbon as a dopant species. In certain embodiments, in which conductive substrate 310 comprises nickel, for example, substrate 310 may be formed utilizing precursors, such as, for example, as Bis(ethylcyclopentadienyl) nickel, bis(methylcyclopentadienyl)nickel, bis(cyclopentadienyl)nickel, or precursors, for example. In these instances, and others, available dopant species in a molecular form may combine with metal ions of conductive substrate 310 to form CEM 320. In certain embodiments, oxidation or oxynitridizing of at least a portion of one or more layers of conductive substrate 310 may be achieved by way of a co-flow of gaseous carbonyl, methane ($CH_4$), acetylene ($C_2H_2$), or other carbon-containing material, for example, with one or more precursors.

In embodiments, after formation of CEM 320, conductive overlay 330 may be deposited or otherwise formed over CEM 320 as depicted in FIG. 3(c). In particular embodiments, conductive overlay 330 may comprise a material identical to that of conductive substrate 310. In other embodiments, however, conductive overlay 330 may comprise a different d-block or f-block material, such as platinum (Pt), titanium (Ti), titanium nitride (TiN), tungsten (W), along with nitrides or oxides thereof. In addition, conductive overlay 330 may utilize a process similar to a process utilized to construct conductive substrate 310, such as PVD, MOCVD, ALD, or may utilize different process, and claimed subject matter is not limited in this respect.

Figures 4A, 4B:
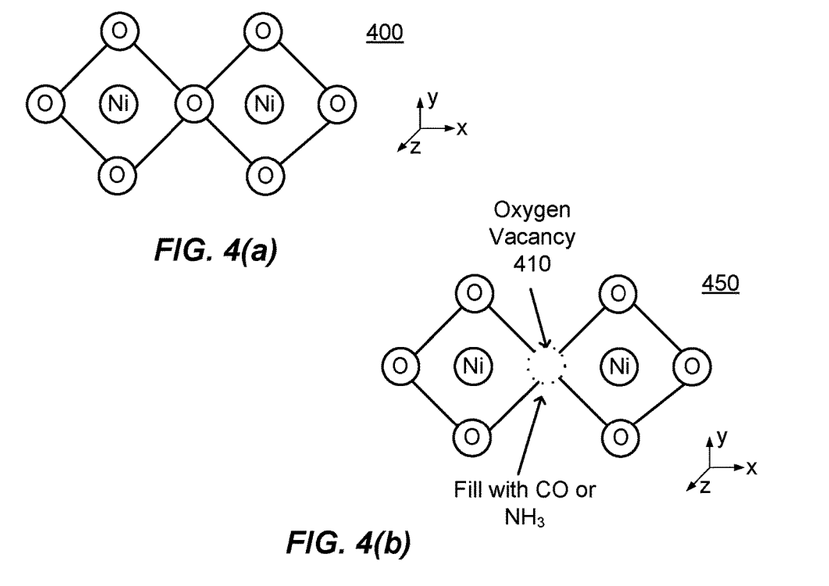
FIGS. 4(a)-4(b) illustrate a representative embodiment a nickel oxide complex of a correlated electron material, and an oxygen vacancy within a nickel oxide complex of a correlated electron material, in accordance with an embodiment.

As an example, FIG. 4(a) is an illustration of a representative NiO complex CEM 320 of FIGS. 3(b)-3(c) according to an embodiment 400. Although Ni atoms in FIG. 4(a) are indicated as being situated among four oxygen atoms oriented in an X-Y plane, oxygen atoms of a NiO complex may, at least in particular embodiments, be situated between two additional nickel atoms oriented in the Z-Y plane of FIG. 4(a), for example. In embodiments, NiO complexes, such as shown in FIG. 4(a), may be arranged to form amorphous NiO, crystalline NiO, or polycrystalline NiO, for example.

FIG. 4(b) is an illustration of a representative embodiment 450 of an oxygen vacancy in a NiO complex of a CEM, such as CEM 320 of FIGS. 3(b)-3(c). In embodiments, oxygen vacancies, such as oxygen vacancy 410, may represent a defect in a lattice structure of a CEM. Defects, such as oxygen vacancy 410, may bring about a degradation in electron back-donation of a CEM material. In turn, a degradation in electron back-donation in CEM 320 may give rise to a decrease in conductivity of CEM 320, an increase in charge storage within CEM 320 (which may operate to increase parasitic capacitance and, consequently, decrease high-frequency switching performance), and/or may degrade other performance aspects of CEM 320, and claimed subject matter is not limited in this respect.

In particular embodiments, diffusion of oxygen and one or more molecular dopants may operate to reduce oxygen vacancies within a CEM, such as within CEM 320. In particular embodiments, perhaps a small percentage of oxygen vacancies, such as oxygen vacancy 410, remain unfilled by a dopant such as CO or $NH_3$, for example. Thus, at least in certain embodiments, an approach toward reducing oxygen vacancies may involve forming a CEM wherein an atomic concentration of a transition metal, d-block, or f-block element does not exceed (e.g., is less than or equal to) an atomic concentration of oxygen, for example, in combination with an appropriate molecular dopant. Such a relationship may be summarized substantially in accordance with expression (7) below:

$$\text{Atomic Concentration}_{(metal, d\text{-}block\ or\ f\text{-}block\ element)} \leq \text{Atomic Concentration}_{(oxygen+dopant)} \quad (7)$$

Expression (7) may be rewritten so as to indicate atomic concentrations oxygen, for example, and molecular dopant in relation to a summation of a total composition of a CEM material, such as CEM 320, substantially in accordance with expression (8) below:

$$\text{Atomic Concentration}_{(oxygen+dopant)} \geq (0.5)\text{Atomic Concentration}_{(Ni+oxygen+dopant)} \quad (8)$$

It should be noted that although expression (8) identifies Ni as a metal utilized in a CEM, embodiments may comprise any transition metal, d-block or f-block element of the periodic table of the elements, or a combination thereof. In a particular embodiment, a CEM may comprise an atomic concentration of Ni of approximately 50.0%. Thus, in view of expression (8), if a CEM comprises an atomic concentration of oxygen approximately equal to 49.0%, the CEM may comprise an atomic concentration of dopant approximately equal to 1.0%. In other embodiments, a CEM may comprise an atomic concentration of dopant within a range approximately equal to 0.1%-25.0%. In certain embodiments, a CEM may comprise an atomic concentration of a dopant within a range approximately equal to 2.0%-15.0%, for example. In particular embodiments, a CEM may comprise an atomic concentration of a transition metal, such as Ni, for example, of at least 1.0%.

Figure 5A:
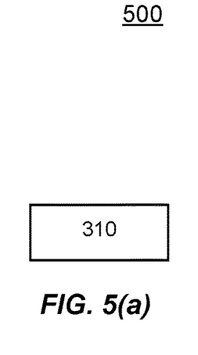
FIGS. 5(a)-5(d) illustrate an embodiment 500 of a sub-process in which a correlated electron material film may be formed from a second conductive substrate deposited on or over a first conductive substrate.
Figure 5B:
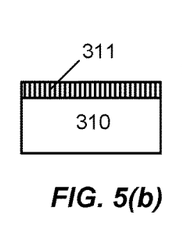

FIGS. 5(a)-5(d) illustrate an embodiment 500 of a subprocess in which a correlated electron material film may be formed from a second conductive substrate deposited on or over a first conductive substrate. In the embodiment of FIG. 5(a), conductive substrate 310 of FIG. 3(a), may be utilized to form a CEM. However, in other embodiments, a CEM may be formed utilizing conductive substrates comprising different d-block or f-block elements of the periodic table of the elements may be utilized. As depicted in FIG. 5(b), second conductive substrate 311 may be deposited on conductive substrate 310. Second conductive substrate 311 may be formed on substrate 310 utilizing any appropriate deposition process, such as PVD, MOCVD, or ALD, or may utilize a different process, and claimed subject matter is not limited in this respect. In particular embodiments, conductive substrate 310 may comprise a first metal (in an atomic concentration of at least 90.0%), such as platinum, copper, aluminum, cobalt, nickel, tungsten, and so forth, and second conductive substrate 311 may comprise a second metal (in an atomic concentration of at least 90.0%), which may differ from the first metal. Thus, in one possible example, conductive substrate 310 may comprise platinum, and second conductive substrate 311 may comprise nickel, although claimed subject matter is not limited in this respect. Additionally, in embodiments, conductive substrate 310 and conductive substrate 311 may be fabricated as a single substrate comprising first and second metals. For example, conductive substrate 310, which may comprise a first metal, may be fabricated in layers utilizing a process such as, for example, atomic layer deposition. Additionally layers, which may form second conductive substrate 311 may be fabricate directly on conductive substrate 310, for example.

In particular embodiments, second conductive substrate 311 may be substantially or even completely converted from a conductive material to CEM 312. In particular embodiments, oxidation of the entire portion of second conductive substrate 311, which can be depicted in FIG. 5(c) by showing CEM 312 extending to the boundary of conductive substrate 310, for example, may bring about an increased concentration of oxidized or oxynitridized CEM at a boundary of conductive substrate 310. In certain embodiments, oxidation of second conductive substrate 311 along with diffusion of a dopant into second conductive substrate 311 may reduce concentration of oxygen vacancies In certain embodiments, increases in oxidation and/or oxynitridizing may occur at a boundary of conductive substrate 310 at least partially in response to a boundary-layer alloy that may form between metals, such as metals comprising a conductive substrate 310 and second conductive substrate 311. In embodiments, a boundary-layer alloy may provide a suitable concentration of discontinuities in microcrystalline structures that comprise conductive substrate 310 and second conductive substrate 311. Discontinuities in microcrystalline structures may provide, for example, oxygen vacancies in a NiO material that may be filled by carbon-containing ligands, such as carbonyl, and/or nitrogen-containing ligands, such as $NH_3$. In embodiments, such filling of oxygen vacancies in, for example, a NiO material may bring about or enhance P-type behavior in a CEM, which may include increased conductivity of the CEM in a low-impedance state. Metallic alloys forming at a metal-to-metal boundary may provide additional opportunities for the formation of oxygen-containing or nitrogen-containing ligands beyond those described, and claimed subject matter is not limited in this respect.

Figure 5C:
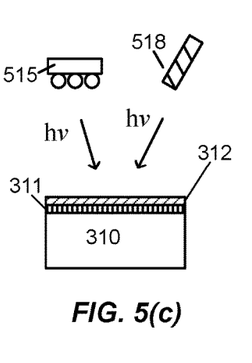

As depicted in FIG. 5(c), second conductive substrate 311 may be converted to CEM by way of a chemical process (e.g., oxidation, oxynitridizing, etc.), or by way of exposure to electromagnetic radiation, such as ultraviolet source 515 or laser source 518, for example. In particular embodiments, exposure to ultraviolet source 515 or laser source 518 (indicated by hv in FIG. 5(c)) may enable CEM fabrication processes to occur without significantly elevating a temperature of a chamber in which device fabrication processes are performed. Thus, in certain embodiments, which utilize an ultraviolet light source in atomic layer deposition processes or chemical vapor deposition processes, for example, a second conductive substrate 311 may be converted to CEM film 312 utilizing a chamber temperature approximately in the range of 100.0° C. to 150.0° C. lower than alternative processes. Accordingly, rather than utilize chamber temperatures that may approach 500.0° C., an atomic layer deposition process or a chemical vapor deposition process to fabricate a CEM film may utilize a chamber temperature approaching, for example, approximately 350.0° C. In particular embodiments, use of CVD or ALD, which may be complemented by thermal energy, plasma activation, hot wire, ultraviolet-assisted deposition, laser-assisted deposition, or combinations thereof, may permit a reduction in chamber temperature from, for example, approximately 500.0° C. to approximately 350.0° C. In particular embodiments, use of ultraviolet source 515 and/or laser source 518 may permit a substrate to be maintained at a temperature below approximately 80.0° C. Thus, thermally-sensitive diffusion of atomic and/or molecular components among conductive substrate 310, second conductive substrate 311, and CEM film 312, may be more tightly controlled than may otherwise be possible. Exposure to ultraviolet and/or laser sources may bring about other advantages, and claimed subject matter is not limited in this respect.

In particular embodiments, such as embodiments utilizing ultraviolet assisted deposition, ultraviolet source 515 may emit radiant energy at ultraviolet or near-ultraviolet wavelengths of between approximately 100.0 and 450.0 nm. Thus, in one possible embodiment, ultraviolet source 515 may comprise a low-pressure mercury lamp that emits a substantial portion of energy at a wavelength of approximately 253.7 nm and 184.9 nm. It should be noted, however, that ultraviolet source 515 may provide ultraviolet energy at additional wavelengths, such as 264.0 nm, 313.2 nm, 365.0 nm, 405.0 nm, and 436.0 nm, and claimed subject matter is not limited in this respect.

In certain embodiments, oxidation and/or oxynitridizing may occur at a boundary of conductive substrate 310 at least partially in response to diffusion of a gaseous oxidizer, for example, through second conductive substrate 311. In embodiments, oxidation and/or oxynitridization may give rise to a concentration of molecular dopant, such as CO and $NH_3$, approximately in the range of 0.1% to 10.0%. Diffusion of an oxidizer through at least a portion of second conductive substrate 311 may occur if, for example, second conductive substrate 311 comprises a relatively thin layer, such as between approximately 10.0 Å and 2000 Å. In other embodiments, diffusion of an oxidizer through at least a portion of second conductive substrate 311 may occur if second conductive substrate 311 comprises a somewhat thicker layer, such as a layer between approximately 10.0 Å and 500.0 Å, for example. Thus, in one example, if second conductive substrate 311 comprises platinum, and conductive substrate 310 comprises nickel, gaseous oxygen ($O_2$) may be diffused through conductive substrate 311 to form nickel oxide at or near a boundary of conductive substrate 310 and second conductive substrate 311. In another example, in which second conductive substrate 311 comprises platinum and conductive substrate 310 comprises nickel carbide (NiC), gaseous $O_2$ may be diffused through conductive substrate 311 to form NiO:CO at or near a boundary of conductive substrate 310 and second conductive substrate 311. In embodiments, diffusing through conductive substrate may give rise to a CEM film comprising an atomic concentration of a combination of oxygen and a dopant comprises less than approximately 50.0% of an atomic concentration of a combination of oxygen, the dopant, and an element selected from the d-block or the f-block of the periodic table of the elements, or a combination thereof. It should be noted that use of platinum, nickel, nickel carbide, and so forth, are described only as illustrative examples, and claimed subject matter is not limited in this respect.

In particular embodiments, if conductive substrate 311 comprises a metal that is more resistant to oxidation than conductive substrate 310, an oxidizing species may be capable of penetrating substrate 311 to form an oxidation layer at the boundary between substrate 310 and second conductive substrate 311. In a particular example, if second conductive substrate 311 comprises a metal that oxidizes but remains conductive, such as ruthenium, presence of a gaseous oxidizer may assist in the formation of, for example, ruthenium oxide. In another particular example, if the second conductive substrate 311 comprises iridium, which remains conductive even if oxidized, presence of a gaseous oxidizer may assist in the formation of iridium oxide. Accordingly, at least in particular embodiments, a diffused gaseous oxidizer may convert second conductive substrate 311 to a conductive oxide and may convert a portion of conductive substrate 310 beneath second conductive substrate 311, to CEM.

In one possible example, if second conductive substrate 311 comprises a thin layer of iridium or ruthenium, such as a layer approximately in the range of 10.0 Å to 2000.0 Å, for example. In other embodiments, for example, second conductive substrate 311 may comprise a somewhat thicker layer such as, for example, a layer having a thickness approximately in the range of 10.0 Å to 1000.0 Å, for example. In particular embodiments, conductive substrate 310 comprises Ni, which may permit gaseous carbonyl (CO)

to be diffused through the iridium or ruthenium to form NiO:CO at or near a boundary of conductive substrate 310 and second conductive substrate 311. In another example, an iridium or ruthenium film may be fabricated utilizing a metalorganic (carbon-containing) precursor, which may operate to leave behind an atomic or more molecular component, such as carbon within the fabricated film. In such an example, gaseous CO may be diffused through the iridium or ruthenium film to form NiO:CO at or near a boundary of conductive substrate 310 and second conductive substrate 311. In another example, conductive substrate 310 may be fabricated utilizing a metalorganic precursor so as to leave behind a molecular component, such as CO, within conductive substrate 310. In such an example, $O_2$ may be diffused through the iridium or ruthenium film to form NiO:CO at or near a boundary of conductive substrate 310 and second conductive substrate 311. It should be noted that use of iridium, ruthenium, nickel, and so forth, are described only as illustrative examples, and claimed subject matter is not limited in this respect.

In certain embodiments, second conductive substrate may be only partially converted to CEM 312, as depicted in FIG. 5(c), for example. In particular embodiments, it may be beneficial to convert no more than a portion of second conductive substrate 311 to CEM 312 so as to maintain a conductive, metal-to-metal contact between conductive substrate 310 and second conductive substrate 311, for example. Conversion of no more than a portion of second conductive substrate 311 to CEM 312 may bring about additional benefits and/or consequences, and claimed subject matter is not limited in this respect.

Figure 5D:
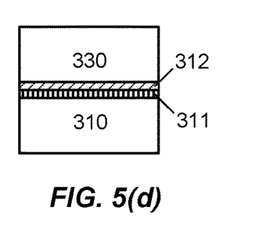

In embodiments, after formation of CEM 312, conductive overlay 330 may be deposited or otherwise formed over CEM 312 as depicted in FIG. 5(d). In particular embodiments, conductive overlay 330 may comprise a material identical to that of conductive substrate 310 or may comprise a different material, such as platinum (Pt), titanium (Ti), titanium nitride (TiN), tungsten (W), or any other d-block or f-block element, along with nitrides or oxides thereof.

Figure 6A:
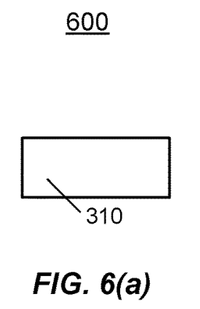
FIGS. 6(a)-6(d) illustrate an embodiment of a sub-process in which a correlated electron material region of a device may be formed from a conductive material utilizing atomic or molecular components diffused from a conductive substrate or a conductive overlay.
Figure 6B:
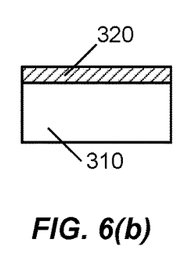
Figure 6C:
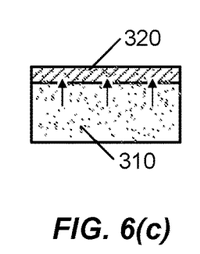
Figure 6D:
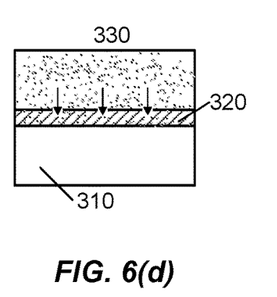

FIGS. 6(a)-6(d) illustrate an embodiment 600 of a subprocess in which a correlated electron material region of a device may be formed from a conductive material utilizing atomic or molecular components diffused from a conductive substrate or a conductive overlay. In FIG. 6(b), second conductive substrate 320 may be formed on substrate 310 (of FIG. 6(a)) utilizing any appropriate deposition process, such as PVD, MOCVD, or ALD, or may utilize a different process, and claimed subject matter is not limited in this respect. At FIG. 6(c), atomic and/or molecular components of conductive substrate 310 are shown diffusing into conductive substrate 320, which may operate to convert second conductive substrate 320 into a CEM. In this context, a "molecular component" as the term is used herein means an atomic or molecular material that converts an d-block or f-block metal to a CEM. For example, if conductive substrate 310 comprises a molecular component of elemental or molecular oxygen, such as $O^-$, $O_2$, $O_3$, for example, diffusion of the molecular component from conductive substrate 310 to second conductive substrate 320 may convert substrate 320 to CEM. In another example, if conductive substrate 310 comprises a molecular component of elemental or molecular nitrogen, such as N, $NH_3$, for example, diffusion of the molecular component from conductive substrate 310 to second conductive substrate 320 may convert substrate 320 to CEM. At FIG. 6(d), atomic and/or molecular components of conductive overlay 330 are shown diffusing into conductive substrate 320, which may operate to convert second conductive substrate 320 into CEM in a manner similar to diffusion of oxides, nitrides, and so forth, from a conductive substrate 310.

Figure 7:
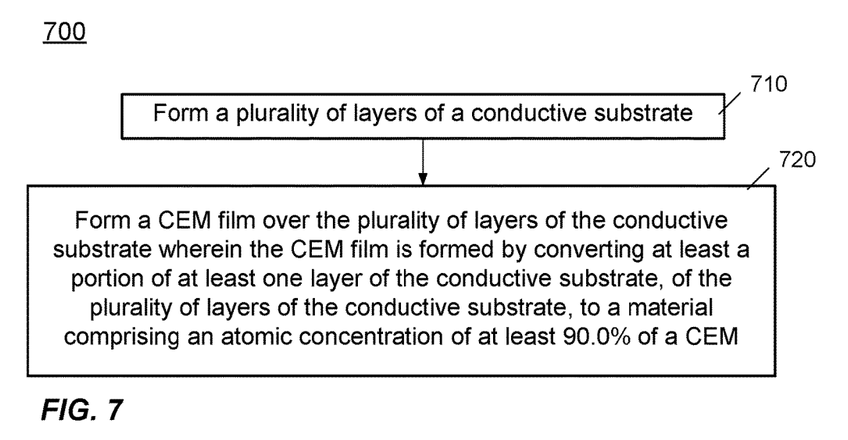
FIG. 7 is a flowchart of an embodiment for a process for fabricating correlated electron devices via conversion of a m conductive substrate to a correlated electron region.

FIG. 7 is a flowchart of an embodiment 700 for a process for fabricating correlated electron devices via conversion of a conductive substrate to a correlated electron region. Example implementations, such as described in FIG. 7, and other figures described herein, may include blocks in addition to those shown and described, fewer blocks, or blocks occurring in an order different than may be identified, or any combination thereof. The method may begin at block 710, which may comprise forming a plurality of layers of a conductive substrate. In embodiments, a conductive substrate may be formed from titanium-based and/or titanium-containing substrate, such as titanium nitride (TiN), fabricated in layers, for example, for use in a CERAM device or other type of CEM-based device. In embodiments, a conductive substrate may comprise d-block or f-block element material other than titanium, such as platinum, copper, aluminum, cobalt, nickel, tungsten, tungsten nitride, cobalt silicide, ruthenium, ruthenium oxide, chromium, gold, palladium, indium tin oxide, tantalum, tantalum nitride, silver, iridium, or iridium oxide or any combination thereof, and claimed subject matter is not limited to any particular composition of conductive substrate material.

The method may continue at block 720, which may comprise forming a CEM film over the plurality of layers of the conductive substrate. A CEM film may be formed by converting at least a portion of at least one layer of the conductive substrate, of the plurality of layers of the conductive substrate, to a CEM. In embodiments, a CEM may comprise transition metals and/or transition metal oxides, such as scandium (Sc), titanium (Ti), vanadium (V), chromium (Cr), manganese (Mn), iron (Fe), cobalt (Co), nickel (Ni), copper (Cu), zinc (Zn), yttrium (Y), or any other d-block or f-block element, or combinations thereof, as described with respect to FIG. 2.

In embodiments, CEM devices may be implemented in any of a wide range of integrated circuit types. For example, numerous CEM devices may be implemented in an integrated circuit to form a programmable memory array, for example, that may be reconfigured by changing impedance states for one or more CEM devices, in an embodiment. In another embodiment, programmable CEM devices may be utilized as a non-volatile memory array, for example. Of course, claimed subject matter is not limited in scope to the specific examples provided herein.

A plurality of CEM devices may be formed to bring about integrated circuit devices, which may include, for example, a first correlated electron device having a first correlated electron material and a second correlated electron device having a second correlated electron material, wherein the first and second correlated electron materials may comprise substantially dissimilar impedance characteristics that differ from one another. Also, in an embodiment, a first CEM device and a second CEM device, comprising impedance characteristics that differ from one another, may be formed within a particular layer of an integrated circuit. Further, in an embodiment, forming the first and second CEM devices within a particular layer of an integrated circuit may include forming the CEM devices at least in part by selective epitaxial deposition. In another embodiment, the first and second CEM devices within a particular layer of the integrated circuit may be formed at least in part by ion implantation, such as to alter impedance characteristics for the first and/or second CEM devices, for example.

Also, in an embodiment, two or more CEM devices may be formed within a particular layer of an integrated circuit at least in part by atomic layer deposition of a correlated electron material. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacently to first and second CEM devices, respectively.

In a further embodiment, one or more of a plurality of CEM devices may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method of constructing a device, comprising:
   forming a plurality of layers of a conductive substrate; and
   forming a correlated electron material (CEM) film over the plurality of layers of the conductive substrate, wherein
   the CEM film is formed by converting at least a portion of at least one layer of the conductive substrate of the plurality of layers of the conductive substrate to a material comprising an atomic concentration of at least 90.0% of a CEM.

2. The method of claim 1, wherein converting the at least the portion of the at least one layer of the conductive substrate to the CEM comprises diffusing nitrogen into the at least one layer of the conductive substrate, wherein the CEM comprises an atomic concentration of nitrogen in the range of about 0.1% to about 10.0%.

3. The method of claim 2, wherein the diffusing the nitrogen into the at least the portion of the at least one layer of the conductive substrate comprises exposing the conductive substrate to gaseous nitrogen.

4. The method of claim 2, wherein the diffusing the nitrogen into the at least the portion of the at least one layer of the conductive substrate comprises annealing the conductive substrate to bring about diffusing of nitrogen from the conductive substrate into the CEM.

5. The method of claim 1, wherein the forming the CEM film comprises oxidizing the at least the portion of the at least one layer of the conductive substrate.

6. The method of claim 5, wherein the forming the CEM film additionally comprises doping the at least the portion of the at least one layer of the conductive substrate wherein, responsive to oxidizing and doping, the CEM film comprises an atomic concentration of a combination of oxygen and a dopant of less than about 50.0% of an atomic concentration of a combination of oxygen, the dopant, and an element selected from the d-block or the f-block of the periodic table of the elements, or a combination thereof.

7. The method of claim 1, wherein the converting the at least the portion of the at least one layer of the conductive substrate to the CEM comprises utilizing plasma activation, hot wire, ultraviolet-assisted deposition or laser-assisted deposition, or any combination thereof.

8. The method of claim 1, wherein the converting the at least the portion of the at least one layer of the conductive substrate to the CEM comprises maintaining a substrate temperature of less than about 80.0° C.

9. The method of claim 1, wherein one or more layers of the plurality of layers of the conductive substrate comprise a first metal, and wherein one or more layers of the plurality of layers of the conductive substrate comprise a second metal, and wherein the converting the at least the portion of the at least one layer of the conductive substrate to the CEM comprises:
   oxidizing one or more layers of the plurality of layers of the conductive substrate, the oxidizing of the one or more layers occurring at a boundary between the first metal and the second metal, wherein the oxidizing gives rise to an atomic concentration of oxygen at the boundary of between about 0.1% and about 10.0%.

10. The method of claim 9, wherein the oxidizing the one or more layers of the plurality of layers of the conductive substrate comprises diffusing oxygen through the first metal or through the second metal, or through a combination thereof, wherein
   responsive to the diffusing, the CEM film comprises an atomic concentration of a combination of oxygen and a dopant of less than about 50.0% of an atomic concentration of a combination of oxygen, the dopant, and an element selected from the d-block or the f-block of the periodic table of the elements, or a combination thereof.

11. The method of claim 9, further comprising doping the CEM utilizing a molecular component from the first metal or from the second metal, or from a combination thereof.

12. The method of claim 1, wherein one or more layers of the plurality of layers of the conductive substrate comprise a first metal, and wherein one or more layers of the plurality of layers of the conductive substrate comprise a second metal, and wherein the converting the at least the portion of the at least one layer of the conductive substrate to CEM comprises:
   oxynitridizing the one or more layers of the plurality of layers of the conductive substrate, the oxynitridizing of the one or more layers occurring at a boundary between the first metal and the second metal, wherein oxynitridizing gives rise to an atomic concentration of nitrogen at the boundary of between about 0.1% and about 10.0%.

13. The method of claim 12, wherein the oxynitridizing the one or more layers of the plurality of layers of the conductive substrate comprises diffusing nitrogen through the first metal or through the second metal, or through a combination thereof.

14. The method of claim 12, further comprising doping the CEM utilizing a molecular component from the first metal or from the second metal, or from a combination thereof.

15. The method of claim 1, wherein the forming the conductive substrate comprises using an atomic layer deposition process, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition or gas cluster ion beam deposition, or any combination thereof.

* * * * *